(12) United States Patent
Bedell et al.

(10) Patent No.: US 10,115,711 B2
(45) Date of Patent: Oct. 30, 2018

(54) VERTICAL LIGHT EMITTING DIODE WITH MAGNETIC BACK CONTACT

(71) Applicant: International Business Machines Corporation, Armonk, NY (US)

(72) Inventors: Stephen W. Bedell, Wappingers Falls, NY (US); Bing Dang, Chappaqua, NY (US); Ning Li, White Plains, NY (US); Frank R. Libsch, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 15/415,505

(22) Filed: Jan. 25, 2017

(65) Prior Publication Data

US 2018/0211941 A1    Jul. 26, 2018

(51) Int. Cl.
| | |
|---|---|
| *H01L 25/07* | (2006.01) |
| *H01L 33/32* | (2010.01) |
| *H01L 33/62* | (2010.01) |
| *H01L 33/30* | (2010.01) |
| *H01L 29/00* | (2006.01) |
| *H01L 25/075* | (2006.01) |

(52) U.S. Cl.
CPC .......... *H01L 25/0753* (2013.01); *H01L 33/30* (2013.01); *H01L 33/32* (2013.01); *H01L 33/62* (2013.01); *H01L 2933/0066* (2013.01)

(58) Field of Classification Search
CPC ..... H01L 25/0753; H01L 33/30; H01L 33/32; H01L 33/62; H01L 2933/0066
USPC .......................................... 257/76
See application file for complete search history.

(56) References Cited

U.S. PATENT DOCUMENTS

| | | | |
|---|---|---|---|
| 2008/0230789 A1* | 9/2008 | Onushkin | ............ H01L 27/156 257/88 |
| 2010/0207156 A1* | 8/2010 | Cho | ............ H01L 33/62 257/99 |
| 2012/0098024 A1* | 4/2012 | Hsu | ............ H01L 33/38 257/99 |
| 2016/0268491 A1* | 9/2016 | Wu | ............ H01L 22/20 |

* cited by examiner

*Primary Examiner* — Didarul Mazumder
(74) *Attorney, Agent, or Firm* — Scully, Scott, Murphy & Presser, P.C.; Louis J. Percello, Esq.

(57) ABSTRACT

A structure containing a vertical light emitting diode (LED) is provided. The vertical LED is present in an opening located in a display substrate, and the vertical LED is coupled to a back contact structure via a magnetic back contact structure. A first top contact structure contacts a topmost surface of the vertical LED and a second top contact structure contacts a surface of the back contact structure.

15 Claims, 3 Drawing Sheets

VERTICAL LIGHT EMITTING DIODE WITH MAGNETIC BACK CONTACT

BACKGROUND

The present application relates to a structure containing a vertical light emitting diode (LED) and a method of forming the same.

A light emitting diode (LED) is a two-lead semiconductor light source. An LED is a p-n junction diode, which emits light when activated. When a suitable voltage is applied to the leads, electrons are able to recombine with electron holes within the device, releasing energy in the form of photons. This effect is called electroluminescence, and the color of the light (corresponding to the energy of the photon) is determined by the energy band gap of the semiconductor material used to provide the p-n junction.

Prior art devices contain lateral LEDs in which contact is made to the sidewalls of the LEDs. Lateral LEDs typically contain high resistance and thus low performance. There is thus a need for providing a structure containing a LED in which the resistance is reduced and the performance is enhanced as compared to the lateral LED containing structures of the prior art.

SUMMARY

A structure containing a vertical light emitting diode (LED) is provided. The vertical LED is present in an opening located in a display substrate, and the vertical LED is coupled to a back contact structure via a magnetic back contact structure. A first top contact structure contacts a topmost surface of the vertical LED and a second top contact structure contacts a surface of the back contact structure.

In one aspect of the present application, a structure is provided that contains a vertical light emitting diode (LED). In one embodiment, the structure includes an opening located in a display substrate. A first (i.e., bottom) contact structure lines at least one sidewall of the opening and a bottom wall of the opening. A first magnetic material is located on a portion of the first contact structure that is located on the bottom wall of the opening, a second magnetic material is located on a surface of the first magnetic material, and a vertical light emitting diode is located on a surface of the second magnetic material. The structure also includes a pair of second (i.e., top) contact structures, wherein one of the second contact structures is in direct contact with a topmost surface of the vertical light emitting diode, and another of the second contact structures is in direct contact with a surface of the first contact structure.

In another aspect of the present, a method of forming a structure containing a vertical light emitting diode (LED) is provided. In one embodiment, the method may include providing an opening in a display substrate. Next, a first contact structure is formed on at least one sidewall of the opening and a portion of a bottom wall of the opening. A first magnetic material is then formed on a portion of the first contact structure that is located on the bottom wall of the opening. Next, a first surface of a second magnetic material of a material stack is bonded to the first magnetic material, wherein the material stack includes a vertical light emitting diode located on a second surface of the second magnetic material, the second surface is opposite the first surface. A pair of second contact structures is then formed, wherein one of the second contact structures is in direct contact with a topmost surface of the vertical light emitting diode, and another of the second contact structures is in direct contact with a surface of the first contact structure.

DETAILED DESCRIPTION

Figure 1:
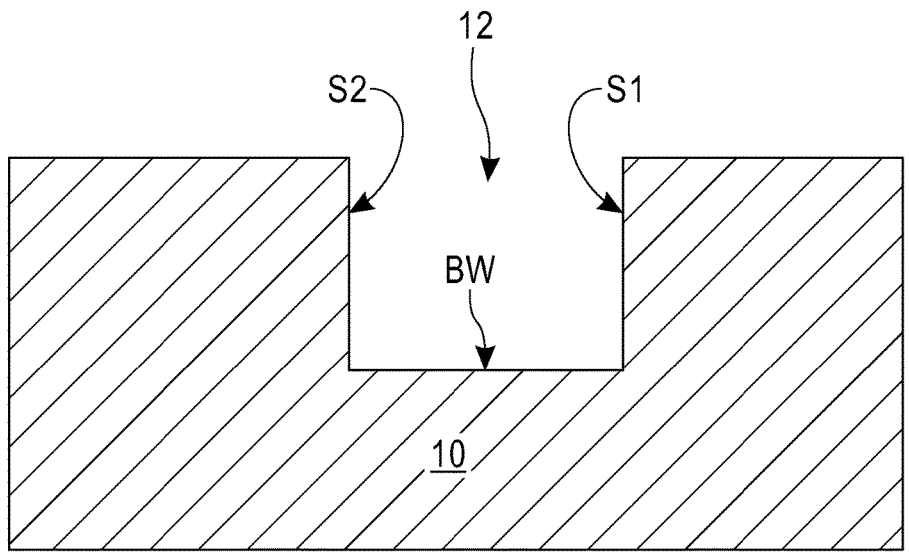
FIG. 1 is a cross sectional view of a first exemplary structure including an opening located in a display substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated a first exemplary structure including an opening 12 located in a display substrate 10 that can be employed in accordance with an embodiment of the present application. Although the present application describes and illustrates a single opening 12, a plurality of spaced apart openings can be formed into the display substrate 10 and can be used in the present application.

The display substrate 10 that can be employed in the present application may include various materials such as, for example, a semiconductor material, an insulator or any combination thereof. The term "semiconductor material" is used throughout the present application to denote a material that exhibits semiconducting properties. Examples of semiconductor materials that can be used to provide the display substrate 10 include, for example, silicon (Si), germanium (Ge), silicon germanium alloys (SiGe), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment of the present application, silicon is employed as the material that provides the display substrate 10.

The semiconductor material that provides the display substrate 10 may be a single material or a combination of semiconductor materials. In some embodiments, a semiconductor-on-insulator including a handle substrate, a buried oxide, and a top semiconductor material may be used as the display substrate 10.

The insulator material that may be employed as the display substrate 10 includes any electrical insulating material such as, for example, glass, a ceramic (such as a carbide, an oxide or a nitride), and/or a plastic. The insulator material that provides the display substrate 10 may be composed of a single electrical insulating material or a combination of electrical insulating materials. In some embodiments, a material stack, in any order, of a semiconductor material and an insulator material may be employed as the display substrate 10.

The display substrate 10 may have a thickness from few microns (e.g., 2 microns) to a few millimeters (e.g., 3 millimeters). Other thicknesses that are lesser than, or greater than, the aforementioned thickness values may be employed as the thickness of the display substrate 10.

The opening 12 that is formed into the display substrate 10 includes sidewalls (S1 and S2) and a bottom wall (BW). In some embodiments, and as shown, the sidewalls S1 and S2 are vertical with respect to the bottom wall (BW) of the opening 12. In other embodiments, the sidewalls S1 and S2 are tapered with respect to the bottom wall (BW) of the opening 12. The opening 12 can be formed by patterning the material or material stack that provides the display substrate 10. In one embodiment, patterning may be performed by lithography and etching. Lithography includes forming a photoresist (not shown) atop a material or material stack to be patterned, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process. Typically, reactive ion etching is used in providing the opening 12. The opening 12 stops within the display substrate 10 exposing a sub-surface portion of the display substrate 10. By "sub-surface portion" it is meant a portion of a material that is located between a topmost surface and a bottommost surface of the material. When multiple openings are formed, the openings may have a same depth, or they may have different depths.

Figure 2:
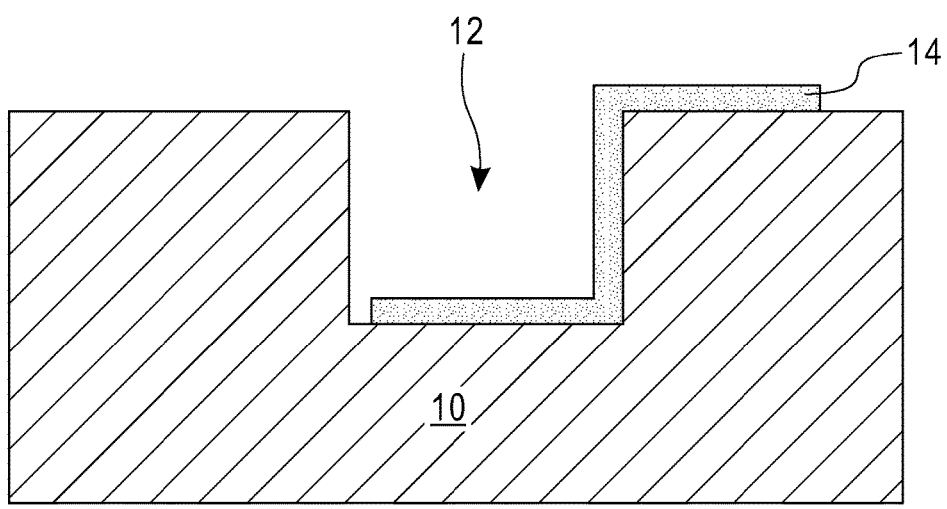
FIG. 2 is a cross sectional view of the first exemplary structure of FIG. 1 after forming a first (i.e., bottom) contact structure lining at least one sidewall of the opening and located on the bottom wall of the opening.

Referring now to FIG. 2, there is illustrated the first exemplary structure of FIG. 1 after forming a first contact structure 14 lining at least one sidewall (i.e., S1) of the opening 12 and located on the bottom wall (BW) of the opening 12. In one embodiment, and as shown, a portion of the first contact structure 14 is located on a topmost surface of the display substrate 10. In the illustrated embodiment, the first contact structure 14 lines only one sidewall (i.e., S1) of the opening 12 and is present only on a portion of the bottom wall (BW) of the opening 12. In other embodiments (not shown), the first contact structure 14 may line each sidewall (S1, and S2) and be present on the entirety of the bottom wall (BW) of the opening 12. In such an embodiment, portions of the first contact structure 14 may extend onto the topmost surface of the display substrate 10 on both sides of the opening 12.

The first contact structure 14 is composed of any ohmic metal or metal alloy. Examples of ohmic metals or metal alloys that may be employed in providing the first contact structure 14 include, but are not limited to, nickel, cobalt, aluminum, titanium, tungsten, palladium, platinum, or nickel silver. The first contact structure 14 may be formed by first providing a blanket layer of an ohmic metal or metal alloy. The blanket layer of ohmic metal or metal alloy can be formed utilizing a deposition process such as, for example, chemical vapor deposition, plasma enhanced chemical vapor deposition, physical vapor deposition, atomic layer deposition, sputtering or plating. After providing the blanket layer of ohmic metal or metal alloy, the blanket layer of ohmic material may be patterned. In one embodiment, patterning may be performed by lithography and etching as defined above.

The first contact structure 14 may have a thickness from 20 nm to 500 nm. Other thicknesses that are lesser than, or greater than, the aforementioned thickness values may also be used as the thickness of the first contact structure 14. In some embodiments, the first contact structure 14 has a conformal thickness. In such an embodiment, the thickness of the first contact structure 14 as measured upwards from a horizontal surface of the display substrate 10 is the same as the thickness of the first contact structure as measured outward from a vertical surface of the display substrate 10.

Figure 3:
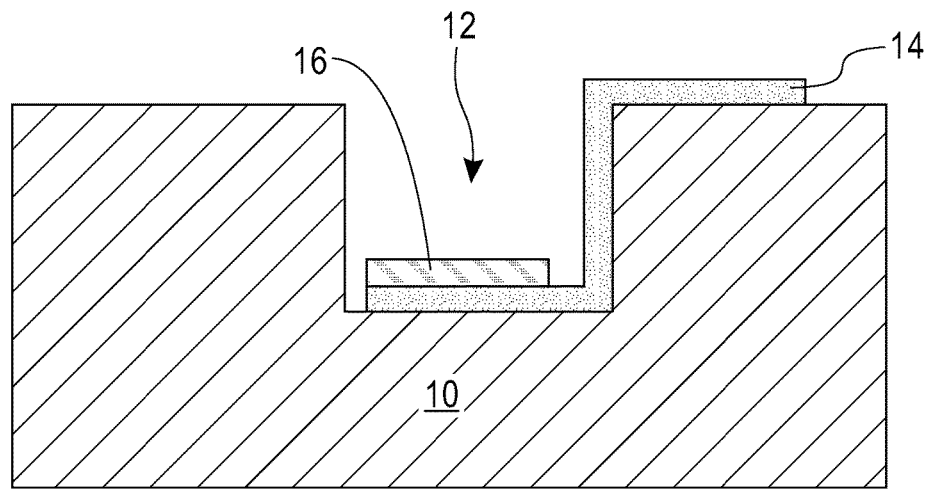
FIG. 3 is a cross sectional view of the first exemplary structure of FIG. 2 after forming a first magnetic material on a portion of the first contact structure that is located on the bottom wall of the opening.

Referring now to FIG. 3, there is illustrated the first exemplary structure of FIG. 2 after forming a first (i.e., bottom) magnetic material 16 on a portion of the first contact structure 14 that is located on the bottom wall (BW) of the opening 12. As is shown, the first magnetic material 16 is present entirely in the opening 12 and is in direct contact with a portion of the first contact structure 14. The first magnetic material 16 does not cover the entirety of the first contact structure 14 that is located on the bottom wall (BW) of the opening 12. As such, a gap is present between a sidewall of the first magnetic material 16 and the first contact structure 14 that lines the sidewall(s) of the opening 12.

The first magnetic material 16 may be composed of any material that has magnetic properties. In one embodiment of the present application, the first magnetic material 16 is composed of a magnetic metal or metal alloy such as, for example, magnetic nickel, magnetic cobalt, magnetic iron or magnetic alloys thereof. In one embodiment, the first magnetic material 16 is composed of magnetic nickel. The first magnetic material 16 may be formed by first providing a blanket layer of magnetic material. The blanket layer of magnetic material can be formed utilizing a deposition process such as, for example, chemical vapor deposition, plasma enhanced chemical vapor deposition, physical vapor deposition, atomic layer deposition, sputtering or plating. After providing the blanket layer of magnetic material, the blanket layer of magnetic material may be patterned. In one embodiment, patterning may be performed by lithography and etching as defined above.

The first magnetic material 16 may have a thickness from 100 nm to 10000 nm. Other thicknesses that are lesser than, or greater than, the aforementioned thickness values may also be used as the thickness of the first magnetic material 16.

Figure 4:
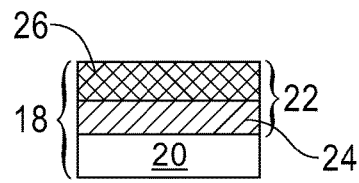
FIG. 4 is a cross sectional view of a second exemplary structure including a material stack of a second magnetic material and a vertical LED that can be employed in accordance with an embodiment of the present application.

Referring now to FIG. 4, there is illustrated a second exemplary structure that includes a material stack 18 of a second magnetic material 20 and a vertical LED 22 that can be employed in accordance with an embodiment of the present application. The material stack 18 is designed to have sidewall surfaces that are vertically aligned with the sidewall surfaces of the first magnetic material 16.

The second magnetic material 20 that can be employed in the present application includes any material that exhibits magnetic properties and can be attracted to the first magnetic material 16 by magnetic force of attraction. In one embodiment, the second magnetic material 20 may be composed of a same magnetic material as the first magnetic material 16 provided that magnetic force of attraction exists between the two magnetic materials. In such an embodiment, magnetic nickel can be used as the magnetic material for both the first and second magnetic materials (16, 20). In another embodiment, the second magnetic material 20 may be composed of a different magnetic material than the first magnetic material 16 provided that magnetic force of attraction exists between the two magnetic materials. The second magnetic material 20 may be formed utilizing one of the deposition techniques mentioned above for providing the first magnetic material 16.

The second magnetic material 20 may have a thickness from 100 nm to 10,000 nm. Other thicknesses that are lesser than, or greater than, the aforementioned thickness values may also be used as the thickness of the second magnetic material 20.

The formation of the second magnetic material 20 can occur prior to, or after forming, the vertical LED 22. In some embodiments, the material stack 18 is formed by first providing blanket layers of the various materials and then subjecting the blanket layers of the various materials to a patterning process such as, for example, lithography and etching as defined above.

The vertical LED 22 includes a stack of, from bottom to top, a first semiconductor material 24 of a first conductivity type, and a second semiconductor material 26 of a second conductivity type that differs from the first conductivity type. In one embodiment, the first conductivity type is p-type and the second conductivity type is n-type. In another embodiment, the first conductivity type is n-type and the second conductivity type is p-type. The term "p-type" refers to the addition of impurities to an intrinsic semiconductor that creates deficiencies of valence electrons. "N-type" refers to the addition of impurities that contributes free electrons to an intrinsic semiconductor. The concentration of dopants that provide the first and second conductivity types may be from $1\times10^{18}$ atoms/cm$^3$ to $5\times10^{21}$ atoms/cm$^3$; other dopant concentrations as possible so long as a p-n junction is provided between the first and second semiconductor materials (24, 26).

The first and second semiconductor materials (24, 26) of material stack 18 include any semiconductor material or combination of semiconductor materials that when a suitable voltage is applied thereto, electrons are able to recombine with electron holes, releasing energy in the form of photons. In one embodiment of the present application, the first and second semiconductors materials (24, 26) are both composed of a III-V compound such as for example, GaN or GaAs.

The LED structure 22 including the first and second semiconductor materials (24, 26) may be formed utilizing any well known method. In one embodiment, an intrinsic base semiconductor material is provided by an epitaxial growth process. The intrinsic base semiconductor material may then be doped to provide the first and second semiconductor materials (24, 26). In another embodiment, the first semiconductor material 24 of the first conductivity type can be formed first, and thereafter the second semiconductor material 26 of the second conductivity type can be formed on the first semiconductor material 24 utilizing an epitaxial growth process. The dopant that provides the second conductivity type can be introducing during the epitaxial growth process itself, or after epitaxial growth utilizing any well known method such as, for example, gas phase doping or ion implantation. In yet other embodiments, the second semiconductor material 26 may be form first, followed by epitaxial growth of the first semiconductor material 24. In such an embodiment, the dopant that provides the first conductivity type can be introducing during the epitaxial growth process itself, or after epitaxial growth utilizing any well known method such as, for example, gas phase doping or ion implantation.

In another embodiment, the LED structure 22 may be formed utilizing a spalling (i.e., a material removal process). Spalling is a useful technique in creating thin film devices by fracturing a surface of a crystalline substrate through use of stress created by differences in material properties of the material to be fractured and a stressor material. In embodiments in which spalling is employed, the first and second semiconductor materials (24, 26) of the LED structure 22 are formed on base substrate. Next, a stressor layer such as a layer of nickel is formed on top of the first and second semiconductor materials (24, 26), wherein the metal stressor layer is deposited to a thickness sufficient to permit mechanically-assisted spalling of the first and second semiconductor materials (24, 26) to occur. A handle layer such as an adhesive tape is then formed on stressor layer and thereafter the first and second semiconductor materials (24, 26) are removed from the base substrate by pulling the handle layer away from the base substrate.

The first and second semiconductor materials (24, 26) of material stack 18 may each have a thickness from 50 nm to 2000 nm. Other thicknesses that are lesser than, or greater than, the aforementioned thickness values may also be used as the thickness of the first and second semiconductor materials (24, 26).

The thickness of the material stack 18 is typically, but not necessarily always, designed such that the entirety of the material stack 18 can be subsequently confined within the opening 12 provided in the display substrate 10. In one embodiment, the thickness of the material stack 18 can be from 100 nm to 10,000 nm.

Figure 5:
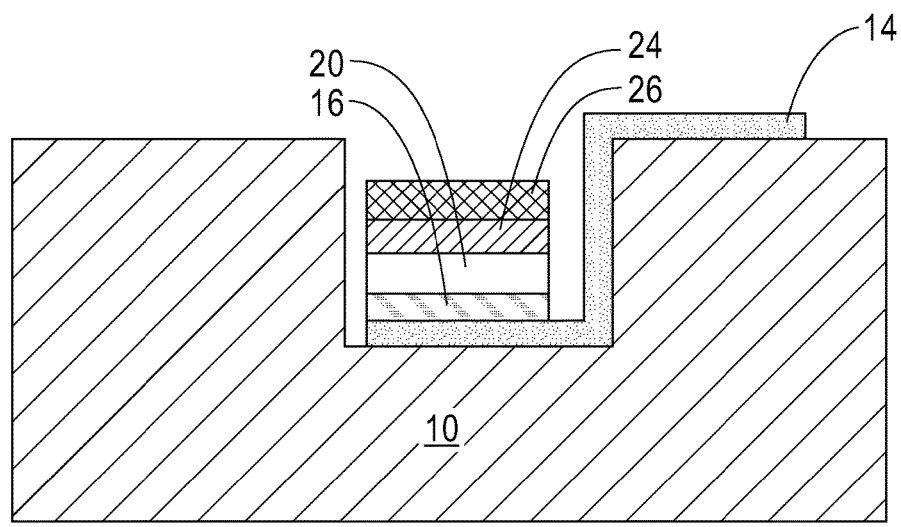
FIG. 5 is a cross sectional view of the exemplary structures of FIGS. 3-4 after bonding the second magnetic material to the first magnetic material.

Referring now to FIG. 5, there is illustrated the exemplary structures of FIGS. 3-4 after bonding the second magnetic material 20 of the material stack 18 to the first magnetic material 20. The first and second magnetic materials (16, 20) are employed as a magnetic back contact, and collectively the first and second magnetic materials (16, 20) may be referred to as a magnetic back contact structure.

In the present application, bonding can be achieved by bringing a physically exposed surface of the second magnetic material 20 of the material stack 18 in proximity to the first magnetic material 16 of the first exemplary structure and thereafter the two magnetic materials are attracted to each by magnetic force of attraction.

In some embodiments, an anneal may be performed to provide a permanent bond between the first and second magnetic materials (16, 20). In such an embodiment, a solder material (not shown) such as, for example, indium, bismuth, gold, tin or alloys thereof can be formed utilizing conventional techniques that are well known to those skilled in the art on a surface of one or both of the first and second magnetic materials (16, 20) prior to bonding; during the anneal the solder material forms a soldered joint, i.e., permanent bond between the first and second magnetic materials (16, 20). The anneal (i.e., bonding anneal) may be performed at a temperature from 100° C. to 1000° C., depending on the annealing time. Typically higher temperature requires less annealing time. Annealing can be done by rapid thermal anneal (RTP), laser anneal, flash anneal, furnace anneal, or any suitable combination of those techniques. In one embodiment, the anneal is performed at 400° C. for 30 seconds. Other temperatures may also be used as long as the anneal temperature is capable of forming a permanent bond between the magnetic held first and second magnetic materials (16, 20). In some embodiments, the anneal may be performed in an inert ambient such as, for example, helium and/or argon. In other embodiments, the anneal may be performed in a forming gas ambient. The duration of the anneal may vary so long as the duration of the anneal causes the formation of a permanent bond between the magnetically held first and second magnetic materials (16, 20).

As is shown in FIG. 5, each of the first magnetic material 16, the second magnetic material 20 and the vertical LED 22 (including the first and second semiconductor materials (24, 26)) is entirely contained in the opening 12. As is further shown, sidewalls of each of the first magnetic material 16, the second magnetic material 20 and the vertical LED 22 (including the first and second semiconductor materials (24, 26)) are vertically aligned to each other. As is even further shown a gap is located between the sidewalls of each of the first magnetic material 16, the second magnetic material 20 and the vertical LED 22 (including the first and second semiconductor materials (24, 26)) and the first metal contact 14 that is present on the at least one sidewall (i.e., S1) of the opening 12.

Figure 6:
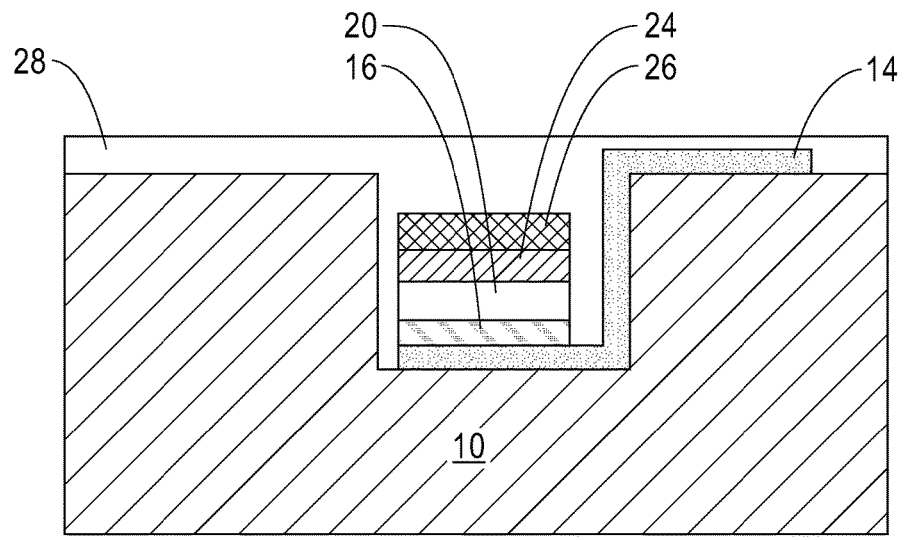
FIG. 6 is a cross sectional view of the exemplary structure of FIG. 5 after forming a dielectric material.

Referring now to FIG. 6, there is illustrated the exemplary structure of FIG. 5 after forming a dielectric material 28. The dielectric material 28 is formed laterally adjacent and above the first contact structure 14, the first magnetic material 16, the second magnetic material 20 and the vertical LED 22. The dielectric material 28 extends above the topmost surface of the display substrate 10 and covers a portion of the first contact structure that is present outside the opening 12. The dielectric material 28 entirely embeds the first contact structure 14, the first magnetic material 16, the second magnetic material 20 and the vertical LED 22.

The dielectric material 28 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as dielectric material 28. The use of a self-planarizing dielectric material as the dielectric material 28 may avoid the need to perform a subsequent planarizing step.

In one embodiment, the dielectric material 28 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the dielectric material 28, a planarization process or an etch back process follows the deposition of the dielectric material that provides the dielectric material 28.

Figure 7:
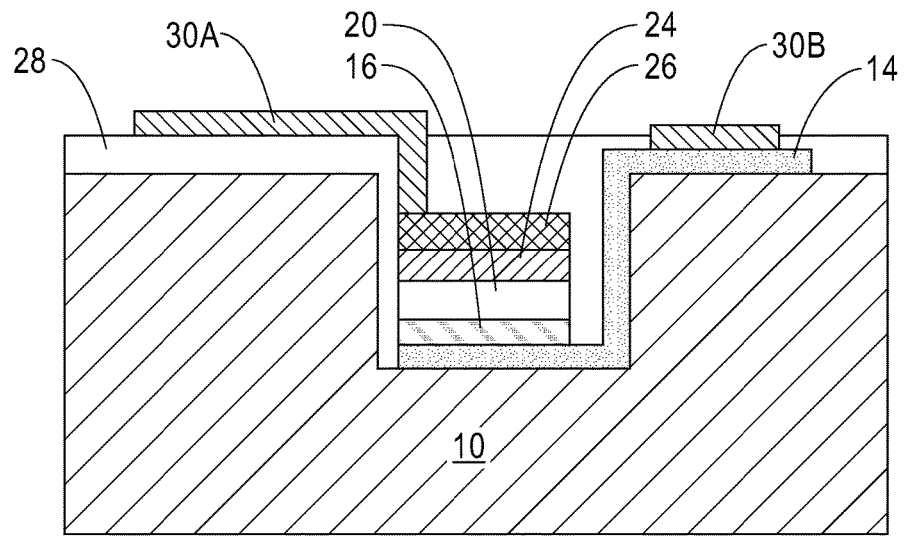
FIG. 7 is a cross sectional view of the exemplary structure of FIG. 6 after forming second (i.e., top) contact structures, wherein one of the second contact structures is in direct contact with a portion of the topmost surface of the vertical LED, and wherein another of the second contact structures is in direct contact with a surface of the first contact structure.

Referring now to FIG. 7, there is illustrated the exemplary structure of FIG. 6 after forming second (i.e., top) contact structures (30A, 30B), wherein one of the second contact structures 30A is in direct contact with a portion of the topmost surface (i.e., the second semiconductor material 26) of the vertical LED 22, and wherein another of the second contact structures 30B is in direct contact with a surface of the first contact structure 14. As is shown, a portion of the pair of second contact structures (30A, 30B) is embedded in the dielectric material 28.

The second (i.e., top) contact structures can be formed by first providing first and second contact openings (not shown) in the dielectric material 28. The first contact opening extends through the dielectric material 28 and physically exposes a portion of the topmost surface (i.e., the second semiconductor material 26) of the vertical LED 22, while the second contact opening extends through the dielectric material 28 and physically exposes a surface of the first contact structure 14 that is present outside the opening 12 and on the topmost surface of the display substrate 10. Next, an ohmic metal or metal alloy is formed in each of the first and second contact openings; the ohmic metal or metal alloy provides the second contact structures (30A, 30B) of the present application. The ohmic metal or metal alloy that provides the second contact structures (30A, 30B) may include one of the ohmic metals or metal alloy mentioned above in providing the first contact structure 14. In one embodiment, the second contact structures (30A, 30B) may include a same ohmic metal or metal alloy as the first contact structure 14. In another embodiment, the second contact structures (30A, 30B) may include a different ohmic metal or metal alloy as the first contact structure 14. The ohmic metal or metal alloy that provides the second contact structures (30A, 30B) may be formed utilizing a deposition process such as, for example, one of the deposition processes mentioned above for forming the ohmic metal or metal alloy of the first contact structure 14. Following the deposition of the ohmic metal or metal alloy that provides the second contact structures (30A, 30B), a patterning process such as, for example, lithography and etching can be performed to provide the exemplary structure shown in FIG. 7.

FIG. 7 illustrates a structure in accordance with the present application. The structure illustrated in FIG. 7 includes an opening 12 located in a display substrate 10. A first (i.e., bottom) contact structure 14 lines at least one sidewall (S1) of the opening 12 and a bottom wall (BW) of the opening 12. A first magnetic material 16 is located on a portion of the first contact structure 14 that is located on the bottom wall (BW) of the opening 12, a second magnetic material 20 is located on a surface of the first magnetic material 16, and a vertical light emitting diode 22 (including the first and second semiconductor materials 24, 26)) is located on a surface of the second magnetic material 20. The structure also includes a pair of second (i.e., top) contact structures (30A, 30B), wherein one of the second contact structures (30A) is in direct contact with a topmost surface of the vertical light emitting diode 22, and another of the second contact structures (30B) is in direct contact with a surface of the first contact structure 14. As is shown, the first and second contact structures (14, 30A, 30B) do not contact any sidewall of the vertical light emitting diode 22. Instead, contact is made from the bottom of the light emitting diode 22 (by the first contact structure 14 through magnetic bottom contact structure (16, 20)) and the top of the light emitting diode 22 (through second contact structure 30A). The structure shown in FIG. 7 has reduced resistance and enhanced performance compared to the lateral LED containing structures of the prior art.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprising:
an opening located in a display substrate;
a first contact structure lining at least one sidewall of the opening and a bottom wall of the opening and present on a topmost surface of the display substrate;
a first magnetic material located on a portion of the first contact structure that is located on the bottom wall of the opening;
a second magnetic material located on a surface of the first magnetic material;
a vertical light emitting diode located on a surface of the second magnetic material and having a topmost surface that is located entirely below a topmost surface of the first contact structure that is located on the topmost surface of the display substrate; and
a pair of second contact structures, wherein one of the pair of second contact structures is in direct contact with a topmost surface of the vertical light emitting diode, and another of the pair of second contact structures is in direct contact with a surface of the first contact structure.

2. The structure of claim 1, further comprising a dielectric material located laterally adjacent and above the first contact structure, the first magnetic material, the second magnetic material and the vertical light emitting diode that are present in the opening, and wherein a portion of the pair of second contact structures is embedded in the dielectric material.

3. The structure of claim 1, wherein each of the first magnetic material, the second magnetic material and the vertical light emitting diode is entirely contained in the opening.

4. The structure of claim 1, wherein sidewalls of each of the first magnetic material, the second magnetic material and the vertical light emitting diode are vertically aligned to each other.

5. The structure of claim 1, wherein each of the first magnetic material and the second magnetic material is composed of magnetic nickel.

6. The structure of claim 1, wherein the vertical light emitting diode includes a stack of, from bottom to top, a first semiconductor material of a first conductivity type, and a second semiconductor material of a second conductivity type that differs from the first conductivity type.

7. The structure of claim 6, wherein each of the first semiconductor material and the second semiconductor material is composed of an III-V compound semiconductor.

8. The structure of claim 7, wherein the III-V compound semiconductor is composed of GaN or GaAs.

9. The structure of claim 1, wherein a portion of the first contact structure is present on the topmost surface of the display substrate.

10. The structure of claim 1, wherein the first contact structure lines only one sidewall of the opening, is present only on a portion of the bottom wall of the opening, and extends onto the topmost surface of the display substrate.

11. The structure of claim 1, wherein the first contact structure is present on both of the sidewall surfaces of the opening.

12. The structure of claim 1, wherein the first contact structure is of unitary construction and is composed of an ohmic metal or metal alloy.

13. The structure of claim 1, wherein the first and second magnetic materials are permanently bonding via solder material.

14. The structure of claim 1, wherein the first and second magnetic materials are held together by magnetic force of attraction.

15. The structure of claim 1, wherein the vertical light emitting diode consists of a first semiconductor material of a first conductivity type and a second semiconductor material of a second conductivity type that differs from the first conductivity type.

* * * * *